United States Patent
Cho

(10) Patent No.: US 7,599,238 B2
(45) Date of Patent: Oct. 6, 2009

(54) SEMICONDUCTOR MEMORY DEVICE AND DRIVING METHOD THEREOF

(75) Inventor: Jin-Hee Cho, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 0 days.

(21) Appl. No.: 11/647,318

(22) Filed: Dec. 29, 2006

(65) Prior Publication Data
US 2008/0002498 A1  Jan. 3, 2008

(30) Foreign Application Priority Data
Jun. 30, 2006  (KR) ..................... 10-2006-0060892

(51) Int. Cl.
*G11C 7/00* (2006.01)
(52) U.S. Cl. .................... 365/205; 365/207; 365/203
(58) Field of Classification Search .............. 365/205, 365/207, 203
See application file for complete search history.

(56) References Cited

U.S. PATENT DOCUMENTS

| 5,291,447 | A | 3/1994 | Kodama et al. | |
| 5,982,692 | A | 11/1999 | Lattimore et al. | |
| 6,154,404 | A * | 11/2000 | Hwang | 365/205 |
| 6,288,928 | B1 * | 9/2001 | Shinozaki | 365/63 |
| 6,868,027 | B2 * | 3/2005 | Kawaguchi | 365/207 |
| 7,012,831 | B2 * | 3/2006 | Shigenami et al. | 365/149 |

FOREIGN PATENT DOCUMENTS

| JP | 4-278288 | 10/1992 |
| KR | 1993-0005578 | 3/1993 |
| KR | 10-2000-0009375 | 2/2000 |
| KR | 10-2000-0066547 | 11/2000 |
| KR | 2002-0025501 | 4/2002 |

OTHER PUBLICATIONS

Korean Office Action, issued in corresponding Korean Patent Application No. 10-2006-0060892, dated on May 15, 2007.

* cited by examiner

*Primary Examiner*—Huan Hoang
(74) *Attorney, Agent, or Firm*—Mannava & Kang, P.C.

(57) ABSTRACT

A semiconductor memory device, for performing a writing operation faster without expanding a driver for the writing operation, includes a bit line sense amplifier (BLSA) for sensing and amplifying a value in a bit line pair, a supply line driver for driving a supply line of the BLSA, a driving controller for controlling the supply line driver in response to a sense amplifier enabling signal, and a sense amplifier enabling signal generator for generating the sense amplifier enabling signal, which is activated based on active and precharge command signals and inactivated during a predetermined part of an writing operation. A driving method of a semiconductor memory device includes enabling the BLSA in response to an active command signal, disabling the BLSA during a predetermined part of an writing operation, enabling the BLSA after the predetermine part, and disabling the BLSA in response to a precharge command signal.

11 Claims, 6 Drawing Sheets

SEMICONDUCTOR MEMORY DEVICE AND DRIVING METHOD THEREOF

CROSS-REFERENCE TO RELATED APPLICATION

The present application claims priority to Korean patent application number 10-2006-0060892, filed in the Korean Patent Office on Jun. 30, 2006, the entire contents of which are incorporated herein by reference.

BACKGROUND OF THE INVENTION

The present invention relates to a semiconductor memory device; and, more particularly, to the semiconductor memory device for controlling a bit line sense amplifier.

Semiconductor memory devices such as a Dynamic Random Access Memory (DRAM) are required to operate faster and be more highly integrated. As semiconductor memory devices operate faster, it is more difficult to maintain margins for operation.

A semiconductor memory device includes a differential bit line pair, i.e., a bit line and a bit line bar. When a word line is activated in response to a row address, data in a plurality of memory cells connected to the word line are transmitted to respective bit line pairs. A bit line sense amplifier senses and amplifies a voltage difference between the differential bit line pair. Data stored in the memory cells are read by the bit line sense amplifier.

FIG. 1 illustrates a block diagram of a conventional synchronous DRAM (SDRAM). The conventional SDRAM includes an input buffer/command decoder 11, a row control unit 12 and a column control unit 13. The input buffer/command decoder 11 buffers a clock CLK, commands /CS, /RAS, /CAS and /WE, and address signals A<0:i> and decodes the commands /CS, /RAS, /CAS and /WE. The input buffer/command decoder 11 outputs row command signals such as a refresh command signal REF, an active command signal ACT and a precharge command signal PRE, and column command signals such as a read command signal RD and a write command signal WT. The row control unit 12 generates row pre-decoding signals RA<0:k> and sense amplifier enabling signals SAEN<0:j> in response to the row command signals and the address signals A<0:i>. The column control unit 13 generates column pre-decoding signals CA<0:1> in response to the column command signals and the address signals A<0:i>.

The conventional SDRAM further includes a plurality of memory cell arrays 18, a plurality of bit line sense amplifier (BLSA) arrays 19, a column decoder 16, row decoders 15 and sense amplifier controllers 17. Each memory cell array and BLSA array are arranged alternately. The column decoder 16, receiving the column pre-decoding signals CA<0:1>, activates a column selecting signal YS corresponding to each column. The row decoders 15, receiving the row pre-decoding signals RA<0:k> and the sense amplifier enabling signals SAEN<0:j>, select one of word lines WL0 to WLk. The sense amplifier controllers 17 control the BLSA arrays 19 in response to the sense amplifier enabling signals SAEN<0:j>.

Each BLSA array operates corresponding to its upper/lower memory cell arrays. The BLSA array is controlled by the sense amplifier enabling signals corresponding to both memory cell arrays.

FIG. 2 illustrates a schematic circuit diagram of the BLSA array and the sense amplifier controller described in FIG. 1. The BLSA array 19-1 includes a plurality of bit line sense amplifiers. Each bit line sense amplifier includes an upper bit line switching unit 23, a sense amplifier 24, a bit line equalizing/precharging unit 25 and a lower bit line switching unit 26. The sense amplifier controller 17-1 includes a sense amplifier supply line driver 22 and a driving control signal generator 21.

The sense amplifier 24 has a latch structure wherein two pull-up PMOS transistors and two pull-down NMOS transistors are cross-connected. The two pull-up PMOS transistors are connected to a pull-up supply line, i.e., a RTO line, on the other side. The two pull-down NMOS transistors are connected to a pull-down supply line, i.e., a SB line, on the other side. The RTO line and the SB line are enabled at predetermined voltage levels in response to the sense amplifier enabling signal SAEN<n>. The sense amplifier 24 senses the voltage difference of the bit line pair, which share charges and have fine voltage difference. The sense amplifier 24 amplifies the bit line pair to a ground voltage VSS and a core voltage VCORE respectively.

The upper bit line switching unit 23 and the lower bit line switching unit 26 each include two NMOS transistors. The upper bit line switching unit 23 determines whether a bit line pair in the upper memory cell array 18-1 is connected to the sense amplifier 24, according to an upper bit line switching signal SHL. The lower bit line switching unit 26 determines whether a bit line pair in the lower memory cell array 18-2 is connected to the sense amplifier 24, according to a lower bit line switching signal SHR.

The bit line equalizing/precharging unit 25 includes three NMOS transistors. The bit line equalizing/precharging unit 25 equalizes and precharges the bit line pair with bit line precharge voltage VBLP in response to a bit line equalizing signal BLEQ.

The sense amplifier supply line driver 22 includes two NMOS transistors. The first NMOS transistor supplies the RTO line with the core voltage VCORE in response to a RTO line driving signal SAP. The second NMOS transistor supplies the SB line with the ground voltage VSS in response to a SB line driving signal SAN.

The driving signal generator 21 includes a plurality of inverters, which delay the sense amplifier enabling signal SAEN<n> and generate the RTO line driving signal SAP and the SB line driving signal SAN.

FIG. 3 illustrates a signal timing diagram of the SDRAM described in FIG. 1. The row pre-decoding signal RA is activated in response to the active command signal ACT. The word line in the memory cell array corresponding to the row pre-decoding signal RA is enabled. The charges stored in cell capacitors are transmitted to the bit line pair. This results in a fine voltage difference between the bit line pair.

After a predetermined delay time from an input of the active command signal ACT, the sense amplifier enabling signal SAEN<n> is activated. In response to SAEN<n>, the RTO line driving signal SAP and the SB line driving signal SAN are activated. The two NMOS transistors in the sense amplifier supply line driver 22 supply the RTO and the SB lines with the core voltage VCORE and the ground voltage VSS respectively. For example, in case that the value '1' is stored in the memory cell, the bit line BL is amplified to the level of core voltage VCORE corresponding to the value '1'. The bit line bar /BL is amplified to the level of ground voltage corresponding to the value '0'.

Thereafter, the column pre-decoding signal CA is activated in response to the read command signal RD. If the column selecting signal YS is activated, the value stored in the bit line pair is output through a data bus.

Likewise, the column pre-decoding signal CA is activated in response to the write command signal WT. If the column selecting signal YS is activated, the value stored in the data bus is transmitted to the bit line pair.

After the value stored in the bit line pair is transmitted to the memory cell, the word line is inactivated in response to the precharge command signal PRE. The sense amplifier 24 is disabled according to inactivation of the sense amplifier enabling signal SAEN<n>. The bit line pair is equalized and precharged to the level of the bit line precharge voltage VBLP.

However, for a writing operation of a value having an opposite value as compared with the value stored in the memory cell, the value latched in the sense amplifier 24 is required to be inversely amended. Accordingly, such a writing operation takes more time as compared with a writing operation of a value having an identical value. The characteristics of write recovery time tWR are deteriorated, particularly in a low power semiconductor memory device.

If a driver for delivering a value into a unit cell during the writing operation is expanded in order to operate fast, the speed of the writing operation is improved. Meanwhile, current consumption increases exponentially.

SUMMARY OF THE INVENTION

A semiconductor memory device in accordance with the present invention performs a writing operation faster without expanding a writing driver.

In accordance with an aspect of the present invention, the semiconductor memory device includes a bit line sense amplifier for sensing and amplifying a value in a bit line pair, a supply line driver for driving a supply line of the bit line sense amplifier, a driving controller for controlling the supply line driver in response to a sense amplifier enabling signal, and a sense amplifier enabling signal generator for generating the sense amplifier enabling signal, which is activated based on active and precharge command signals and inactivated during a predetermined part of an writing operation.

In accordance with another aspect of the present invention, the semiconductor memory device includes a bit line sense amplifier for sensing and amplifying a value in a bit line pair, a row control unit for generating a first sense amplifier enabling signal in response to active and precharge command signals, a column control unit for generating a write column selecting signal in response to read and write command signals, a sense amplifier enabling signal generator for receiving the first sense amplifier enabling signal and write column selecting signal and generating a second sense amplifier enabling signal, which is inactivated during a predetermined part of an writing operation, a supply line driver for driving a supply line of the bit line sense amplifier, and a driving controller for controlling the supply line driver in response to the second sense amplifier enabling signal.

In accordance with further aspect of the present invention, a driving method of the semiconductor memory device includes generating a first sense amplifier enabling signal in response to active and precharge command signals, generating a write column selecting signal in response to read and write command signals, generating a second sense amplifier enabling signal, which is inactivated during a predetermined part of an writing operation, in response to the first sense amplifier enabling signal and the write column selecting signal, and sensing/amplifying a value in a bit line pair in response to the second sense amplifier enabling signal.

Finally, a driving method of the semiconductor memory device, in accordance with the present invention, includes enabling a bit line sense amplifier in response to an active command signal, disabling the bit line sense amplifier during a predetermined part of an writing operation in response to a write command signal, enabling the bit line sense amplifier after the predetermine part, and disabling the bit line sense amplifier in response to a precharge command signal.

DESCRIPTION OF THE SPECIFIC EMBODIMENTS

For a writing operation of a value having an opposite value as compared with a value in a memory cell, a latch value in a bit line sense amplifier is required to be reversed. It causes heavy loads particularly in a low power semiconductor. In the present invention, the writing operation is performed faster by temporarily disabling the bit line sense amplifier during the writing operation. A column selecting signal is used to determine the period to disable the bit line sense amplifier. Ideally, the bit line sense amplifier is disabled right before activation of the column selection signal. With respect to decreasing current consumption and operation time, maximum efficiency is achieved.

The present invention also efficiently decreases the writing operation time and improves characteristics with respect to write recovery time tWR. Because the speed of the writing operation is improved without expanding a driver for the writing operation, current consumption can be reduced.

Hereinafter, a semiconductor memory device in accordance with the present invention will be described in detail referring to the accompanying drawings.

Figure 1:
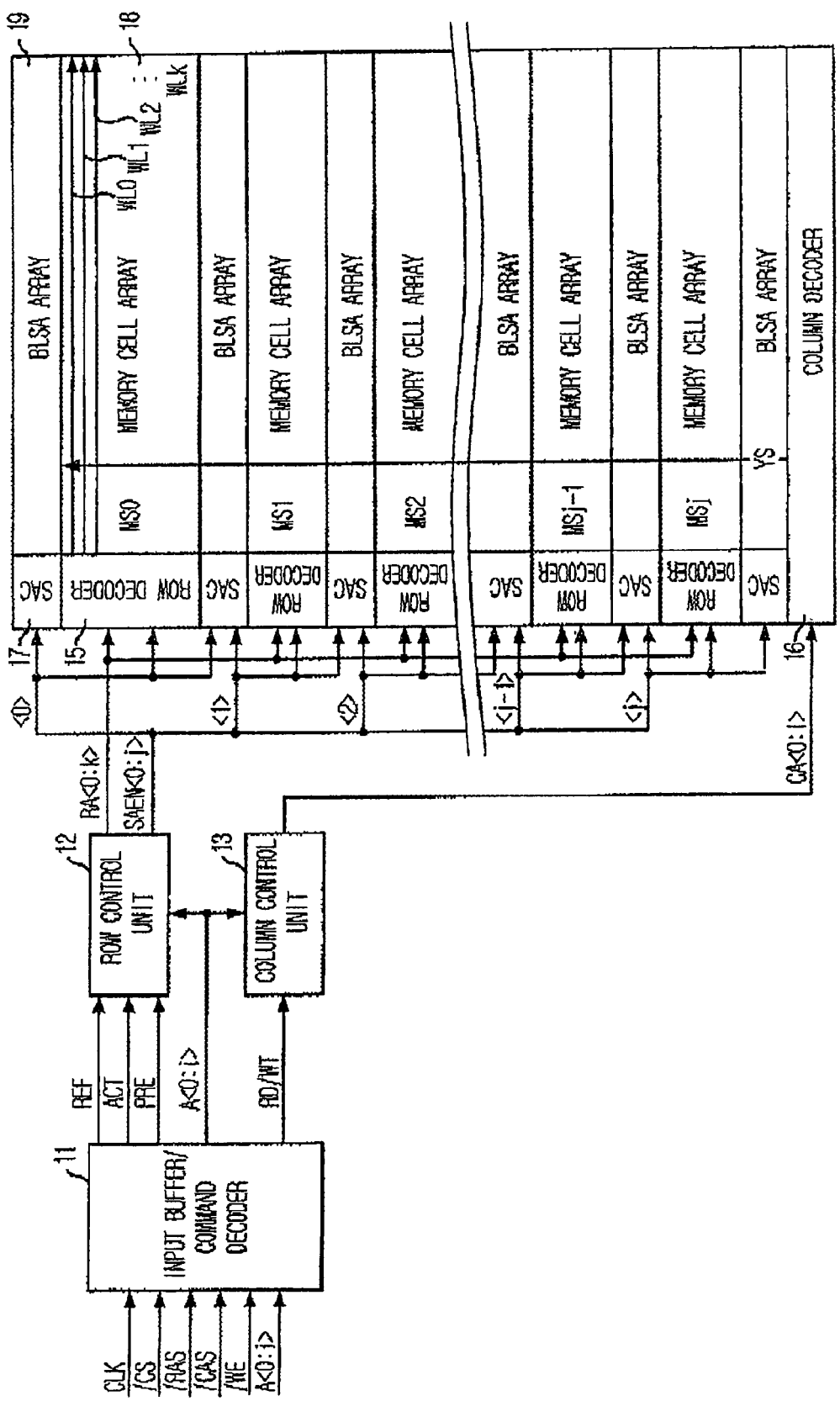
FIG. 1 illustrates a block diagram of a conventional SDRAM.
Figure 2:
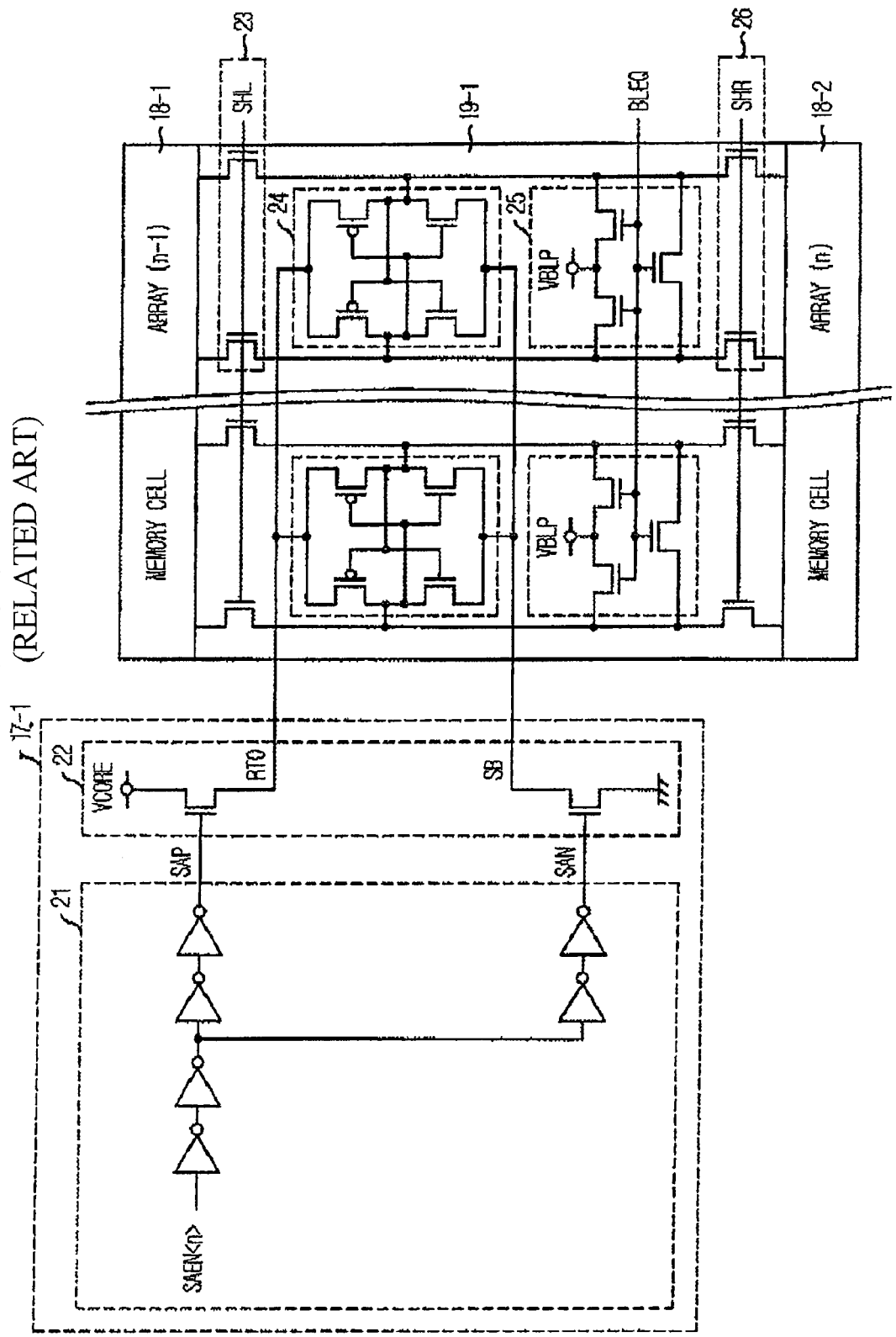
FIG. 2 illustrates a schematic circuit diagram of a bit line sense amplifier array and a sense amplifier controller described in FIG. 1.
Figure 3:
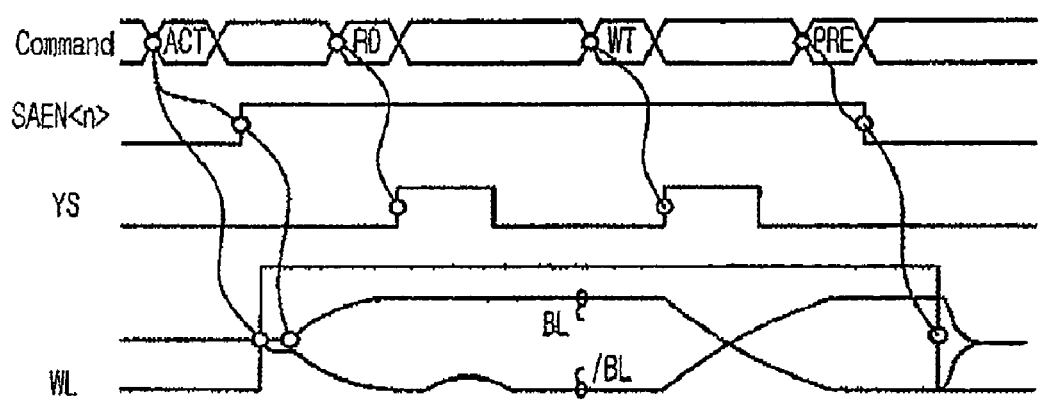
FIG. 3 illustrates a signal timing diagram of the SDRAM described in FIG. 1.
Figure 4:
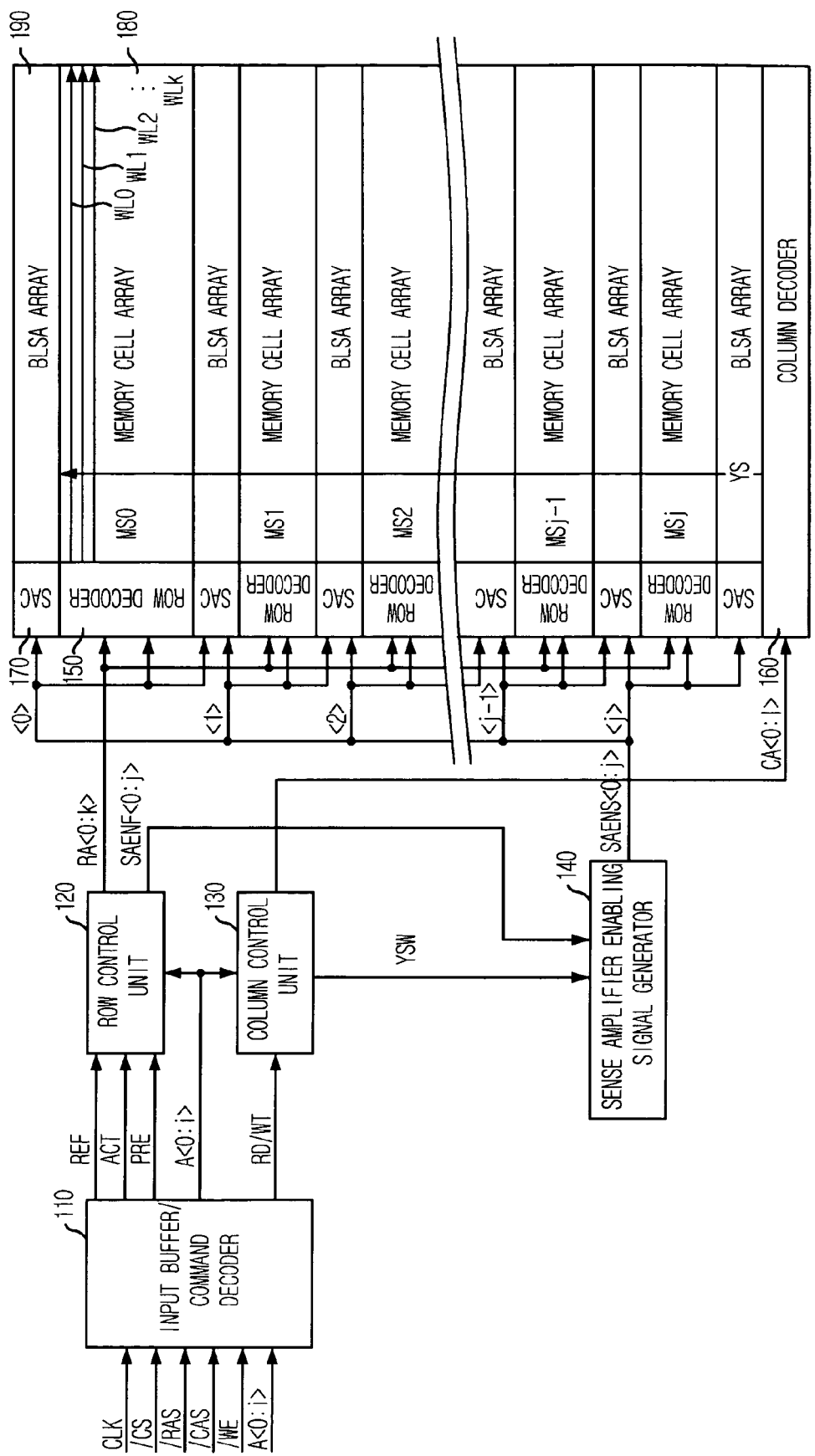
FIG. 4 illustrates a block diagram of a SDRAM in accordance with the present invention.

FIG. 4 illustrates a block diagram of a SDRAM in accordance with the present invention. The SDRAM includes an input buffer/command decoder 110, a row control unit 120, a column control unit 130 and a sense amplifier enabling signal generator 140. The input buffer/command decoder 110 buffers a clock CLK, commands /CS, /RAS, /CAS and /WE, and address signals A<0:i> and decodes the commands /CS, /RAS, /CAS and /WE. The input buffer/command decoder 110 outputs row command signals such as a refresh command signal REF, an active command signal ACT and a precharge command signal PRE, and column command signals such as a read command signal RD and a write command signal WT. The row control unit 120 generates row pre-decoding signals RA<0:k> and first sense amplifier enabling signals SAENF<0:j> in response to the row command signals and the address signals A<0:i>. The column control unit 130 generates column pre-decoding signals CA<0:l> and write column selecting signal YSW in response to the column command signals and the address signals A<0:i>. The sense amplifier enabling signal generator 140 generates second sense amplifier enabling signals SAENS<0:j> in response to the first sense amplifier enabling signals SAENF<0:j> and the write column selecting signal YSW.

The SDRAM further includes a plurality of memory cell arrays 180, a plurality of bit line sense amplifier () arrays 190, a column decoder 160, row decoders 150 and sense amplifier controllers 170. Each memory cell array and array are arranged alternately. The column decoder 160, receiving the column pre-decoding signals CA<0:1>, activates a column selecting signal YS corresponding to each column. The row decoders 150, receiving the row pre-decoding signals RA<0:k>, select one of word lines WL0 to WLk. The sense amplifier controllers 170 control the BLSA arrays 190 in response to the second sense amplifier enabling signals SAENS<0:j>.

The each BLSA array operates corresponding to its upper/lower memory cell arrays. The BLSA array is controlled by the second sense amplifier enabling signals corresponding to both memory cell arrays.

The write column selecting signal YSW has faster phase than the column selecting signal YS, determining disabling timing of the sense amplifier during the writing operation. Generally, the column selecting signal YS is activated with a predetermined pulse width after a predetermined delay time from activation of the read or the write command signal. It is easy to generate the write column selecting signal YWS by phasing the column selecting signal YS faster in the column control unit 130.

Figure 5:
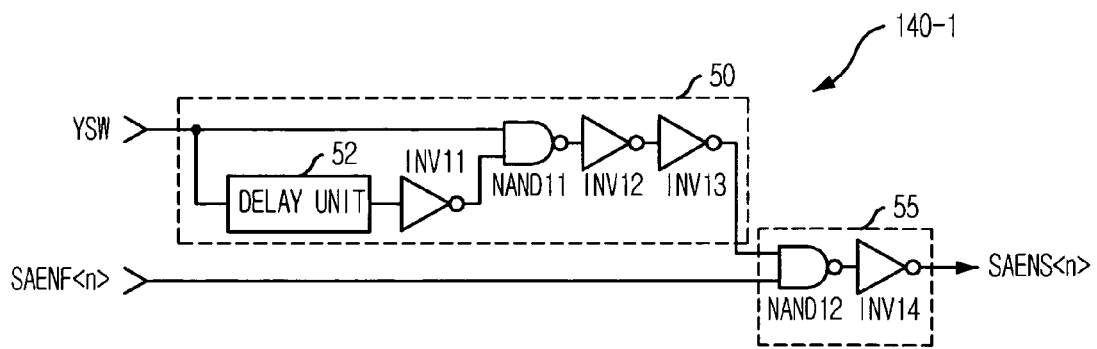
FIG. 5 illustrates a schematic circuit diagram of a sense amplifier enabling signal generator described in FIG. 4.

FIG. 5 illustrates a schematic circuit diagram of the sense amplifier enabling signal generator 140 described in FIG. 4. The sense amplifier enabling signal generator 140 includes a plurality of sense amplifier enabling signal generating units for receiving the first sense amplifier enabling signals SAENF<0:j>. Because the sense amplifier enabling signal generating units have a substantially identical structure, one embodiment is described. A sense amplifier enabling signal generating unit 140-1 includes a pulse generator 50 and signal comparator 55. The pulse generator 50 activates a signal with a predetermined pulse width at the rising edge of the write column selecting signal YSW. The signal comparator 55, receiving an output of the pulse generator 50 and the first sense amplifier enabling signal SAENF<n>, generates the second sense amplifier enabling signal SAENS<n>.

The pulse generator 50 includes a delay unit 52, a NAND gate NAND11 and inverters. The delay unit 52 delays the write column selecting signal YSW. The inverter INV11 receives an output of the delay unit 52. The NAND gate NAND11 receives the write column selecting signal YSW and an output of the inverter INV11. The inverter INV12 receives an output of the NAND gate NAND11. The inverter INV13 receives an output of the inverter INV12.

The signal comparator 55 includes a NAND gate NAND12 and an inverter INV14. The NAND gate receives an output of the pulse generator 50 and the first sense amplifier enabling signal SAENF<n>. The inverter INV14, receiving an output of the NAND gate NAND12, outputs the second sense amplifier enabling signal SAENS<n>.

Figure 6:
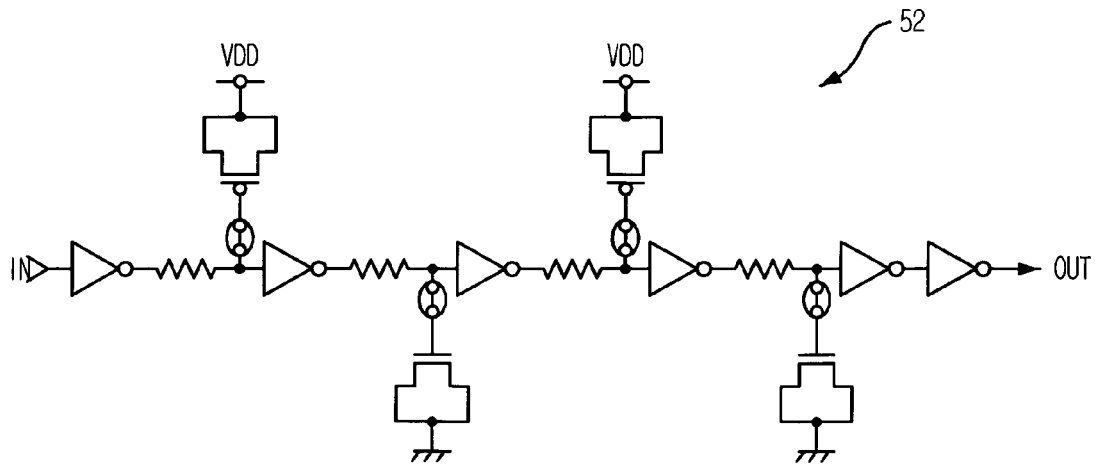
FIG. 6 illustrates a schematic circuit diagram of a delay unit described in FIG. 5.

FIG. 6 illustrates a schematic circuit diagram of the delay unit 52 described in FIG. 5. The delay unit 52 includes an inverter chain, resistors and capacitors. The inverter chain is embodied by an even number of inverters. The resistors are connected to an output of the each inverter. The capacitors are embodied by PMOS transistors, connected to the supply voltage VDD, and NMOS transistors, connected to the ground voltage VSS. The delay time of the delay unit 52 can be set according to the disabling period of the second sense amplifier enabling signal SAENS<n>.

Figure 7:
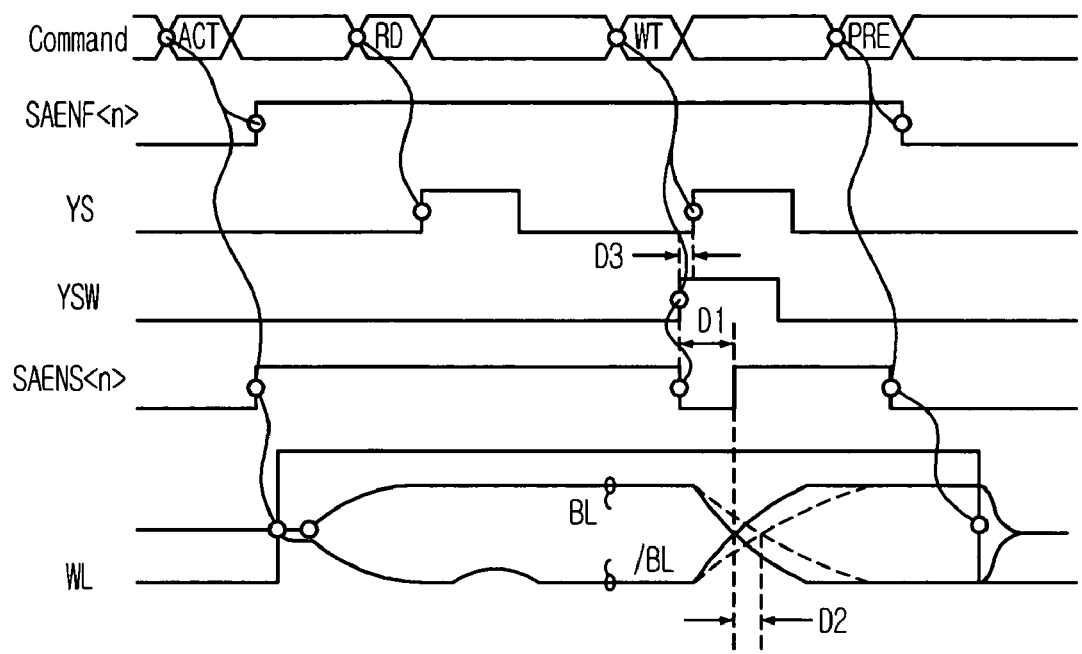
FIG. 7 illustrates a signal timing diagram of the SDRAM described in FIG. 4.

FIG. 7 illustrates a signal timing diagram of the SDRAM device described in FIG. 4. The row pre-decoding signal RA is activated in response to the active command signal ACT. The word line in the memory cell array corresponding to the row pre-decoding signal RA is enabled. The charges stored in cell capacitors are transmitted to the bit line pair. It results in a fine voltage difference between the bit line pair.

After a predetermined delay time from an input of the active command signal ACT, the first sense amplifier enabling signal SAENF<n> is activated. The RTO line driving signal SAP and the SB line driving signal SAN are activated. The two NMOS transistors in the sense amplifier supply line driver 22 supply the RTO and the SB lines with the core voltage VCORE and the ground voltage VSS respectively.

Thereafter, the column pre-decoding signal CA is activated in response to the read command signal RD. And then, the column selecting signal YS is activated. The value stored in the bit line pair is output through a data bus. Because it is activated in response to the write command WT, the write column selecting signal YSW is not activated in reading operation.

Meanwhile, the column pre-decoding signal CA is also activated in response to the write command signal WT. And then, the column selecting signal YS is activated. A value stored in the data bus is transmitted to the bit line pair. The write column selecting signal YSW is activated faster than the column selecting signal YS by the amount of time D3. At the activation of the write column selecting signal YSW, the second sense amplifier enabling signal SAENS<n> is inactivated during the period, corresponding to the delay time of the delay unit 52 in the sense amplifier enabling signal generator 14, illustrated as the amount of time D1.

Thereafter, the second sense amplifier enabling signal SAENS<n> is activated again. The value stored in the bit line pair is transmitted to the memory cell. The word line is inactivated in response to the precharge command signal PRE. The second sense amplifier enabling signal SAENS<n> is also inactivated. The sense amplifier 24 is disabled and the bit line pair is equalized and precharged to the level of the bit line precharge voltage VBLP.

While the sense amplifier 24 is disabled temporally, a write driver transmits the value. Accordingly, when the value having a value opposite to the pre-stored value is written, the value latched in the sense amplifier 24 can be reversed faster by amount of time illustrated as D2, as compared with conventional operation. The speed of the writing operation is improved. Characteristics with respect to write recovery time tWR are also improved.

While the write column selecting signal YSW, having faster phase than the column selecting signal YS, is used to disable a sense amplifier temporally, the column selecting signal YS can be used. Even if a signal, having slower phase, is used, it is more efficient than conventional operation.

In addition, the present invention can be applied to the over driving structure, different from the normal driving structure in the above embodiment. The above embodiment of the sense amplifier enabling signal generator is just one example, among a plurality of embodiment methods possible. According to the types or the polarity of signals used, the embodiment method can be changed in logic.

Besides the SDRAM in the above embodiment, every type of semiconductor device memory devices, which include bit line sense amplifier, such as DRAM, DDR, DDR2 and DDR3, can apply the present invention.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device, comprising:
a bit line sense amplifier for sensing and amplifying a value in a bit line pair;
a supply line driver for driving a supply line of the bit line sense amplifier;
a driving controller for controlling the supply line driver in response to a first sense amplifier enabling signal; and
a sense amplifier enabling signal generator for generating the first sense amplifier enabling signal, which is activated based on active and precharge command signals and inactivated during a predetermined part of a writing operation prior to activating a column selecting signal corresponding to a write command signal,
wherein the driving controller includes:
a row control unit for generating a second sense amplifier enabling signal in response to the active and precharge command signals; and
a column control unit for generating the column selecting signal in response to a read command signal and the write command signal.

2. A semiconductor memory device, comprising:
a bit line sense amplifier for sensing and amplifying a value in a bit line pair;
a control unit for controlling the bit line sense amplifier,
wherein the control unit includes:
a row control unit for generating a first sense amplifier enabling signal in response to active and precharge command signals;
a colunm control unit for generating a write colunm selecting signal in response to a read command signal and a write command signal; and
a sense amplifier enabling signal generator for receiving the first sense amplifier enabling signal and the write column selecting signal, thereby to generate a second sense amplifier enabling signal which is inactivated during the predetermined part of the writing operation,
whereby the bit line sense amplifier is inactivated during a predetermined part of a writing operation prior to activating the column selecting signal corresponding to the write command signal.

3. The semiconductor memory device as recited in claim 2, the control unit includes:
a supply line driver for driving a supply line of the bit line sense amplifier; and
a driving controller for controlling the supply line driver in response to the second sense amplifier enabling signal.

4. The semiconductor memory device as recited in claim 2, wherein the write column selecting signal is activated before the colunm selecting signal corresponding to the write command signal is activated.

5. The semiconductor memory device as recited in claim 4, wherein the sense amplifier enabling signal generator includes:
a pulse generator for activating a signal with a predetermined pulse width at the rising edge of the write column selecting signal; and
a signal comparator for receiving an output of the pulse generator and the first sense amplifier enabling signal and generating the second sense amplifier enabling signal.

6. The semiconductor memory device as recited in claim 5, wherein the pulse generator includes:
a delay unit for delaying the write column selecting signal;
a first inverter for receiving an output of the delay unit;
a first NAND gate for receiving the write column selecting signal and an output of the first inverter;
a second inverter for receiving an output of the first NAND gate; and
a third inverter for receiving an output of the second inverter.

7. The semiconductor memory device as recited in claim 6, wherein the signal comparator includes:
a second NAND gate for receiving an output of the pulse generator and the first sense amplifier enabling signal;
a fourth inverter for receiving an output of the second NAND gate and outputting the second sense amplifier enabling signal.

8. The semiconductor memory device as recited in claim 6, wherein a delay time of the delay unit corresponds to a temporally disabling period of the second sense amplifier enabling signal in the writing operation.

9. A method for driving a semiconductor memory device, comprising:
generating a first sense amplifier enabling signal in response to active and precharge command signals;
generating a write column selecting signal in response to read and write command signals;
generating a second sense amplifier enabling signal, which is inactivated during a predetermined part of an writing operation, in response to the first sense amplifier enabling signal and the write colunm selecting signal; and
sensing/amplifying a value in a bit line pair in response to the second sense amplifier enabling signal.

10. The method as recited in claim 9, wherein the write column selecting signal is activated, before a colunm selecting signal corresponding to the write command signal is activated.

11. A method for driving a semiconductor memory device, comprising:
enabling a bit line sense amplifier in response to an active command signal;
disabling the bit line sense amplifier during a predetermined part of a writing operation in response to a write command signal;
enabling the bit line sense amplifier after the predetermined part; and
disabling the bit line sense amplifier in response to a precharge command signal,
wherein, the bit line sense amplifier is disabled during the predetermined part prior to activating a column selecting signals corresponding to the write command signal.

* * * * *